US007970149B2

(12) United States Patent
Reardon et al.

(10) Patent No.: US 7,970,149 B2
(45) Date of Patent: Jun. 28, 2011

(54) AUDIO SPEAKER WITH PARTIALLY SPHERICAL SPEAKER HOUSING AND ESCUTCHEON

(75) Inventors: Patrick G. Reardon, Coto de Caza, CA (US); Peter L. Lam, S. Pasadena, CA (US); Mark W. Jones, Long Beach, CA (US); Pablo C. Tobiano, Metro Manila (PH)

(73) Assignee: BBY Solutions, Inc., Richfield, MN (US)

( * ) Notice: Subject to any disclaimer, the term of this patent is extended or adjusted under 35 U.S.C. 154(b) by 1734 days.

(21) Appl. No.: 11/191,870

(22) Filed: Jul. 28, 2005

(65) Prior Publication Data

US 2007/0025580 A1 Feb. 1, 2007

(51) Int. Cl.

| | |
|---|---|
| ***H04R 1/02*** | (2006.01) |
| ***H04R 9/06*** | (2006.01) |
| ***H05K 5/00*** | (2006.01) |
| ***A47B 81/06*** | (2006.01) |

(52) U.S. Cl. .......... 381/87; 381/386; 381/387; 381/389; 381/336; 181/153; 181/199; 181/150

(58) Field of Classification Search .................... 381/87, 381/385–389, 182, 392–395, 336; 181/141, 181/144–152, 171, 199, 153

See application file for complete search history.

(56) References Cited

U.S. PATENT DOCUMENTS

| | | | |
|---|---|---|---|
| 4,441,577 | A | 4/1984 | Kurihara |
| 4,597,470 | A | 7/1986 | Takagi et al. |
| 4,891,842 | A | 1/1990 | Green |
| 4,917,212 | A | 4/1990 | Iwaya |
| 5,133,428 | A | 7/1992 | Perrson |
| 5,201,896 | A | 4/1993 | Kruszewski |
| 5,321,760 | A | 6/1994 | Gray |
| 5,400,407 | A | 3/1995 | Cassity et al. |
| 5,574,796 | A | 11/1996 | Keezer |
| 5,960,095 | A | 9/1999 | Chang |
| 6,101,262 | A | 8/2000 | Haase et al. |
| 6,343,135 | B1 | 1/2002 | Ellero et al. |
| 6,347,776 | B1 | 2/2002 | Chuang |
| 6,356,640 | B1 | 3/2002 | Lin |
| 2002/0097889 | A1 | 7/2002 | Makino |
| 2003/0048917 | A1 | 3/2003 | Manrique et al. |
| 2003/0190050 | A1 | 10/2003 | Lee |
| 2004/0005073 | A1 | 1/2004 | Liu |

OTHER PUBLICATIONS

Box for Linear Series LS075DT Speakers (sold by Applicant for more than a year prior to the filing date of the application). No date available.*
Box for Linear Series LS075DT Speakers (sold by Applicant for more than a year prior to the filing date of the application).
Box for Linear Series LS100DT Speakers (sold by Applicant for more than a year prior to the filing date of the application).

* cited by examiner

*Primary Examiner* — Devona E Faulk
(74) *Attorney, Agent, or Firm* — Beck & Tysver PLLC

(57) ABSTRACT

A speaker housing assembly including an adapter and a speaker enclosure is disclosed. The adapter has an escutcheon and a partially spherical recessed concave portion. The speaker enclosure has a partially spherical sidewall that is received in the recessed concave portion of the adapter. A lock assembly secures the speaker enclosure to the adapter through an arcuate slot. Flanges of the lock assembly are placed in registry with teeth formed on opposite sides of the arcuate slot to lock the speaker enclosure in place. An elastomeric pad is provided between the recessed concave portion and the partially spherical sidewall to dampen vibrations and supplement the locking engagement of the lock assembly.

30 Claims, 5 Drawing Sheets

AUDIO SPEAKER WITH PARTIALLY SPHERICAL SPEAKER HOUSING AND ESCUTCHEON

BACKGROUND OF THE INVENTION

1. Field of the Invention

The present invention relates to a speaker, a partially recessed housing and an escutcheon that are adapted to be attached to a wall or ceiling.

2. Background Art

Audio speakers are provided in a wide variety of types and styles for broadcast music, recorded music players, and video entertainment systems, and the like. Audio systems may be designed for use in buildings, in vehicles, or at outdoor locations. Some audio speakers are specifically designed for use in a vehicle. Other audio speakers are specifically designed for use in homes, business, or other buildings and are not appropriate for use in vehicles. Recreational vehicles such as motor homes, trailers, or boats are normally designed to provide all the comforts and convenience of home, but they are normally provided with 12 volt vehicle audio systems. Speakers designed for use in buildings are not used in recreational vehicles because they are difficult to attach to the recreational vehicle in an attractive and secure manner.

Speakers designed to be used in vehicles are generally flush mounted in a dashboard top, package shelf behind a seating area, or inside interior panels. Speciality vehicles such as motor homes, trailers and boats generally have speakers that are flush mounted to the wall or ceiling of the speciality vehicle. Flush mounted speakers normally cannot be aimed to focus sound in a desired direction except in the direction perpendicular to the plane of the wall or ceiling to which the speaker is mounted. Flush mounted speakers are not generally adjustable and must be mounted within the space provided behind an interior wall or ceiling. Flush mounting arrangements may limit acoustic performance. Bracket mounted speakers may be used in recreational vehicles, but are usually relatively unattractive. Bracket mounts increase the amount of space required for the speakers.

There is a need for a speaker mounting arrangement that is attractive and minimizes space requirements. There is also a need for a speaker mount that can be directed toward a listening position. There is also a need for a speaker mounting arrangement that may be suitable for home or vehicle use and that is particularly well suited for use in recreational vehicles. Applicants' invention addresses these needs and problems as summarized below.

SUMMARY OF THE INVENTION

According to one aspect of the present invention, an adjustable speaker housing assembly is provided that is adapted to be secured to a wall. The adjustable speaker housing assembly comprises an adapter for securing the speaker housing assembly to the wall that includes a wall mounting portion and a recessed concave portion. A guide track is arranged on the concave portion of the adapter. A speaker enclosure is assembled to the concave portion of the adapter. The speaker enclosure has an inset portion and a projecting portion. At least one speaker is secured within the speaker enclosure. An interlocking element may be selectively locked to secure the speaker enclosure to the adapter in one position and may be unlocked to permit the speaker enclosure to move relative to the adapter.

According to another aspect of the invention, an adjustable speaker system is provided that is adapted to be secured to a wall. The adjustable speaker system comprises an adapter for securing the speaker system to the wall that has a wall mounting portion and a recessed portion. A speaker housing is secured to the adapter in a partially recessed relationship with the adapter. The speaker housing has an inset portion and includes at least one speaker secured within the speaker housing. The inset portion of the speaker housing is disposed within the recessed portion of the adapter in a ball and socket relationship.

According to other aspects of the invention, the concave portion of the adapter and the inset portion of the speaker enclosure are at least partially spherical in shape. The inset portion of the speaker enclosure may slide relative to the concave portion of the adapter. The guide track may comprise a linear slot formed in the concave portion of the adapter. The slot has a first inter-engaging portion that engages a second inter-engaging portion of the interlocking element when the interlocking element is locked. The linear slot may receive speaker wires that extend from the speaker enclosure that are adapted to be connected to an audio source.

According to another aspect of the invention, a screw may be inserted through the first and second inter-engaging portions and a threaded nut may be secured to the inset portion of the speaker enclosure to secure the enclosure and adapter together. This clamping arrangement forms the sole connector between the speaker enclosure and the adapter.

According to other aspects of the invention, the concave portion adapter and the wall mounting portion may be formed in one piece in a molding operation. The concave portion of the adapter may be a first partially spherical wall with the inset portion of the speaker enclosure defining a second partially spherical wall.

According to other aspects of the invention, an elastomeric pad may be provided between the concave portion and the inset portion. The elastomeric pad may be adhesively secured to the concave portion of the adapter.

These and other aspects of the invention will be better understood in view of the attached drawings and following detailed description of the illustrated embodiments of the invention.

DETAILED DESCRIPTION OF THE PREFERRED EMBODIMENT(S)

Figure 1:
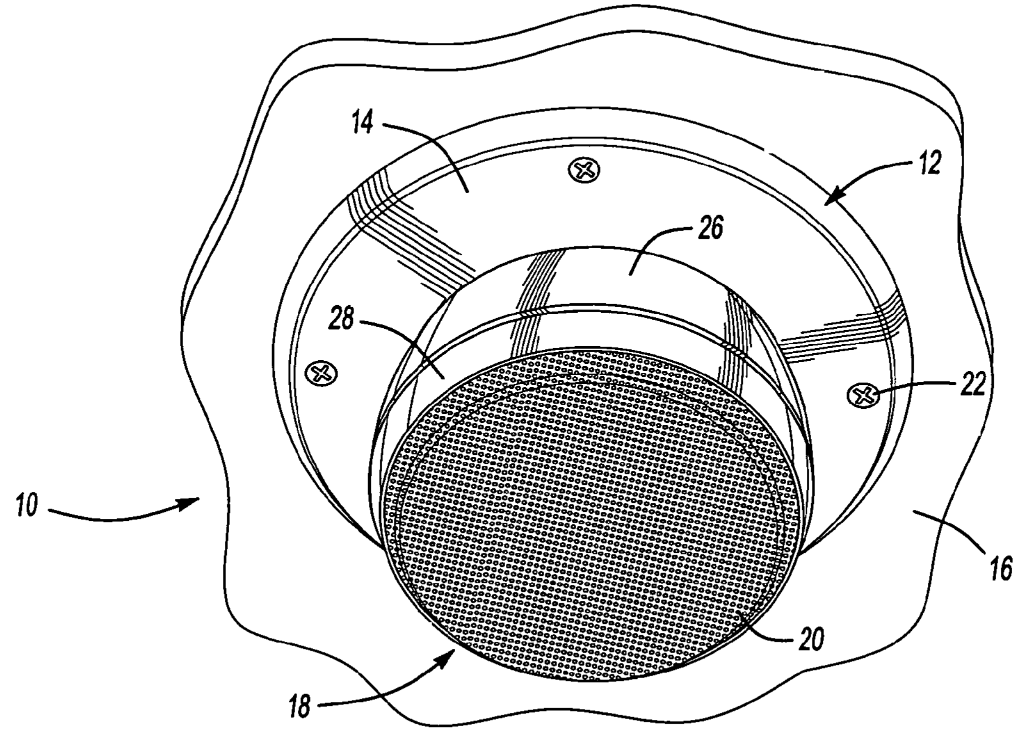
FIG. 1 is a perspective view of an adjustable speaker housing assembly secured to a supporting surface according to one embodiment of the present invention.
Figure 2:
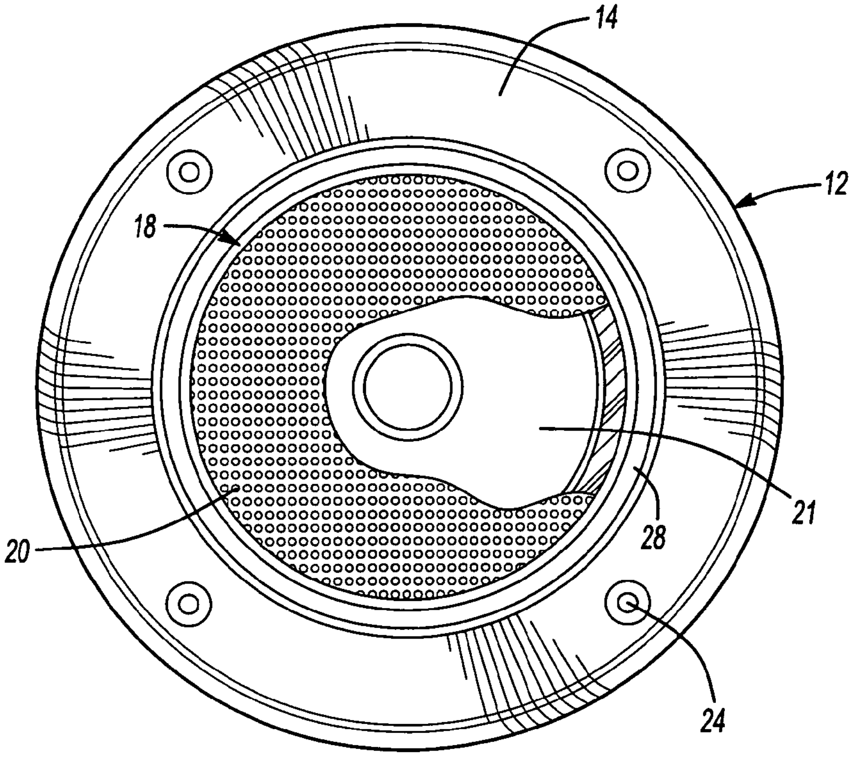
FIG. 2 is a front elevation view of the adjustable speaker housing assembly shown in FIG. 1.

Referring to FIGS. 1 and 2, the speaker housing assembly 10 of the present invention is illustrated. In FIG. 1, the speaker housing assembly 10 is shown with its adapter 12 having an escutcheon 14 secured to a supporting surface 16. A speaker enclosure 18 having a speaker grill 20 that covers a speaker 21 is shown attached to the adapter 12. A plurality of screws 22 are secured to the supporting surface 16 through holes 24 formed in the escutcheon 14. The speaker enclosure 18 has a partially spherical side wall 26 and a grill retention ring 28 that retains the speaker grill 20 on the speaker enclosure 18.

Figure 3:
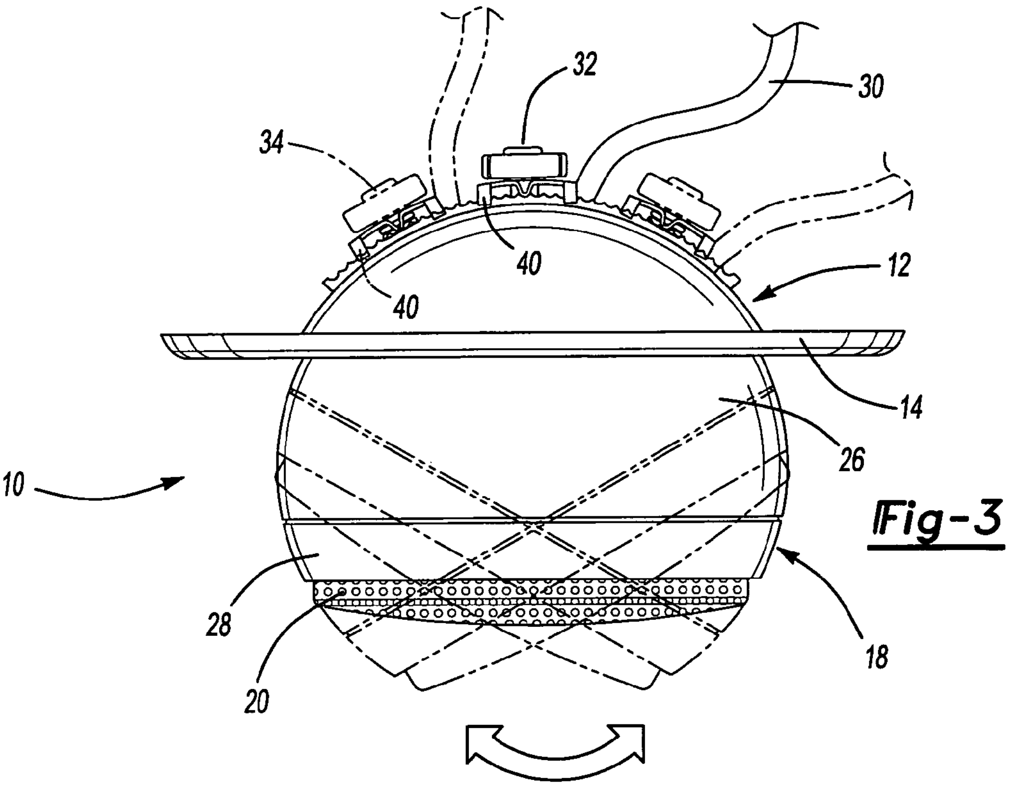
FIG. 3 is a side elevation view thereof showing a speaker housing secured to an adapter in one position with additional positions being shown in phantom lines.
Figure 4:
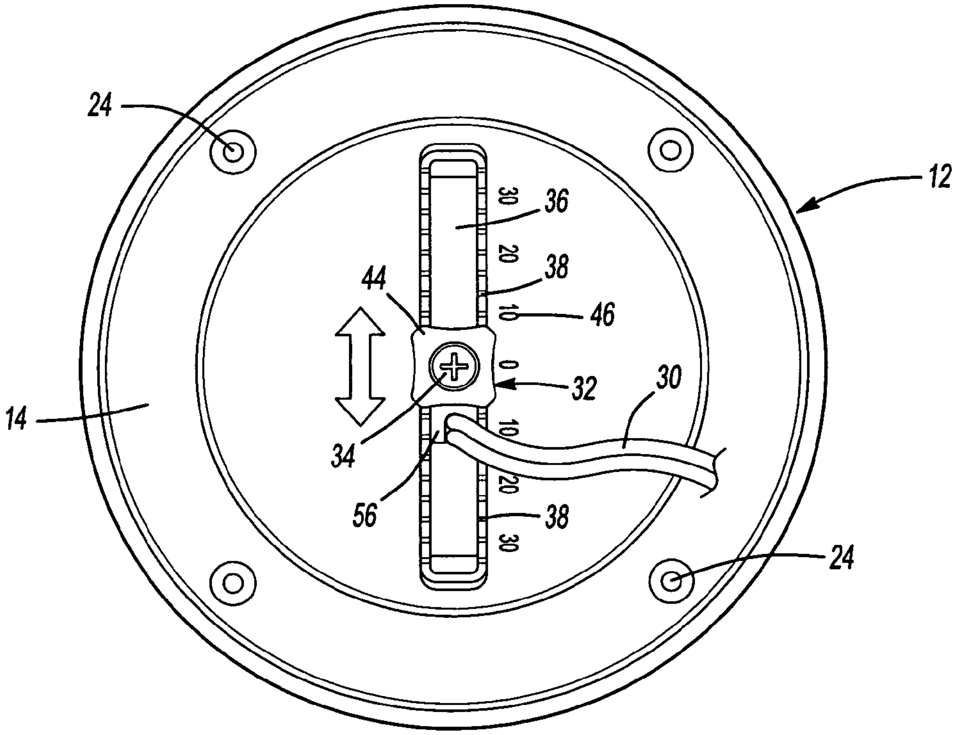
FIG. 4 is a rear elevation view of the adjustable speaker housing assembly.

Referring to FIGS. 3 and 4, adjustment of the orientation of the speaker enclosure 18 relative to the adapter 12 is illustrated. A speaker wire 30 extends from the speaker enclosure 18 and is connected to an audio amplifier, as is well known in the art. A lock assembly 32 is provided to lock the speaker enclosure 18 in a selected orientation relative to the adapter 12. The lock assembly 32 includes a screw 34 that extends through an arcuate slot 36 formed in the adapter 12. The arcuate slot 36 is formed with teeth 38 on opposite sides of the arcuate slot 36. Flanges 40 on a spring clip 42 are placed in registry with the teeth 38 when the lock assembly 32 is engaged. A finger knob 44 is provided to facilitate tightening the lock assembly 32. The finger knob 44 receives and is held against the spring clip 42 by the screw 34.

Referring to FIG. 4, indicia 46 are provided adjacent the arcuate slot 36 to facilitate aligning the speaker enclosure 18 relative to the adapter 12. The indicia corresponds to the angular offset of the lock assembly 32 along the length of the arcuate slot 36. As illustrated in FIG. 4, the lock assembly 32 is at 0°, which corresponds to the position of the speaker enclosure 18, as shown in FIG. 3. The speaker enclosure 18 position may be adjusted, for example, by shifting the lock assembly 32 to a position adjacent the indicia "30." This would allow the speaker enclosure to be placed at a 30° angle relative to the adapter 12.

Figure 5:
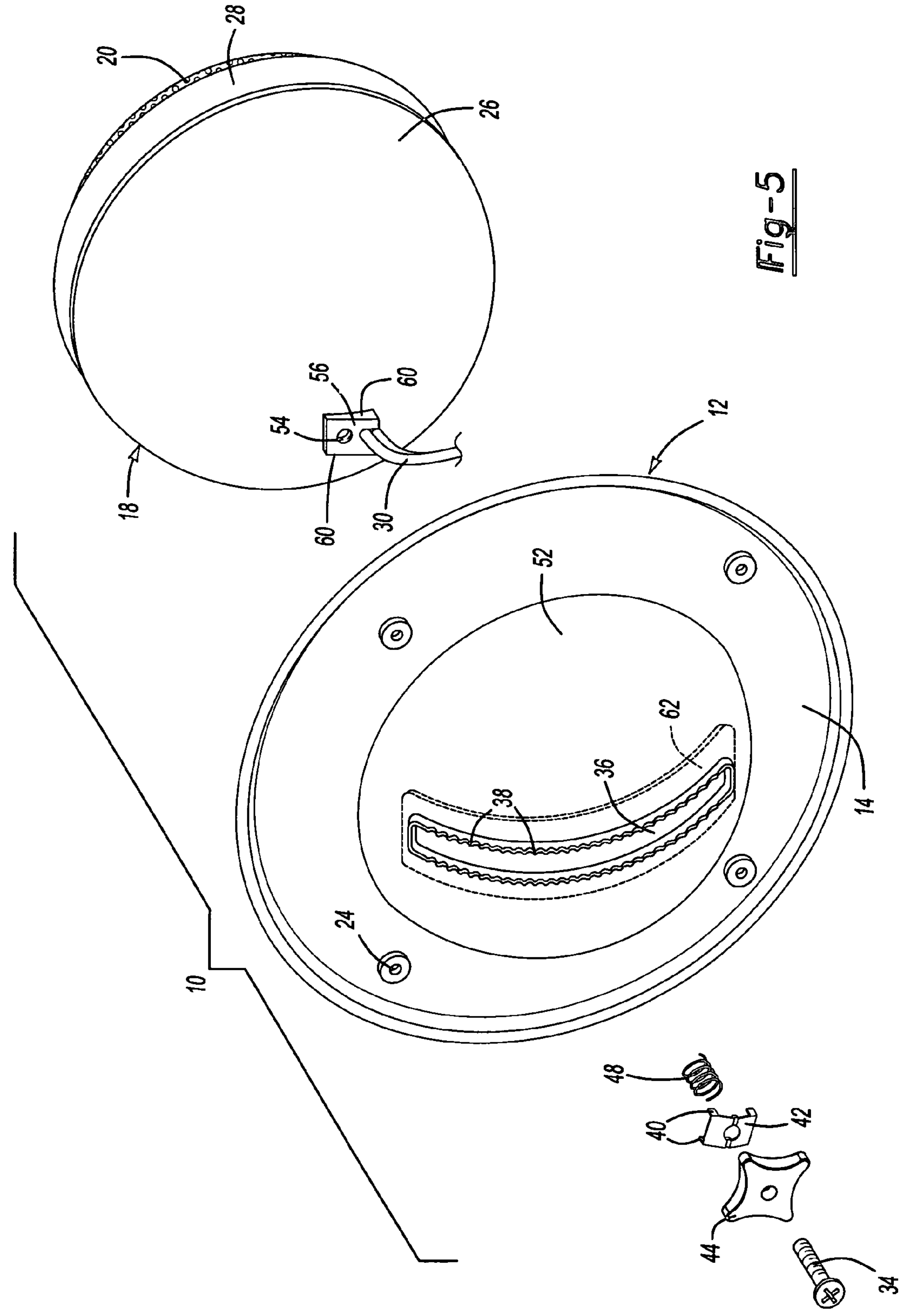
FIG. 5 is an exploded rear perspective view of the adjustable speaker housing assembly.

Referring to FIG. 5, the speaker housing assembly 10 is shown in exploded perspective. The adapter 12 is shown separated from the speaker enclosure 18. The lock assembly 32 is shown to include the screw 34 that is inserted through the finger knob 44, the spring clip 42, and the helical spring 48.

The arcuate slot 36 is formed in a partially spherical recessed concave portion 52 of the adapter 12. The concave portion 52 as illustrated is a continuous partially spherical area that may be integrally molded with the escutcheon 14. Alternatively, the concave portion 52 could be in the form of an arcuate band.

A nut 54 is assembled to the partially spherical sidewall 26 and is disposed within a follower 56 on the sidewall 26. The speaker wire 30 may also extend through the follower 56. The follower 56 is inserted into the arcuate slot 36. Parallel walls 60 of the follower 56 engage opposite walls of the arcuate slot 36. The parallel walls 60 guide the movement of the speaker enclosure 18 relative to the adapter 12 by following the opposite sides of the arcuate slot 36.

An elastomeric pad 62 is shown in phantom in FIG. 5. The elastomeric pad 62 functions to absorb vibrations and also provides a resilient layer against which the speaker enclosure 18 may be drawn as the lock assembly 32 is tightened.

Figure 6:
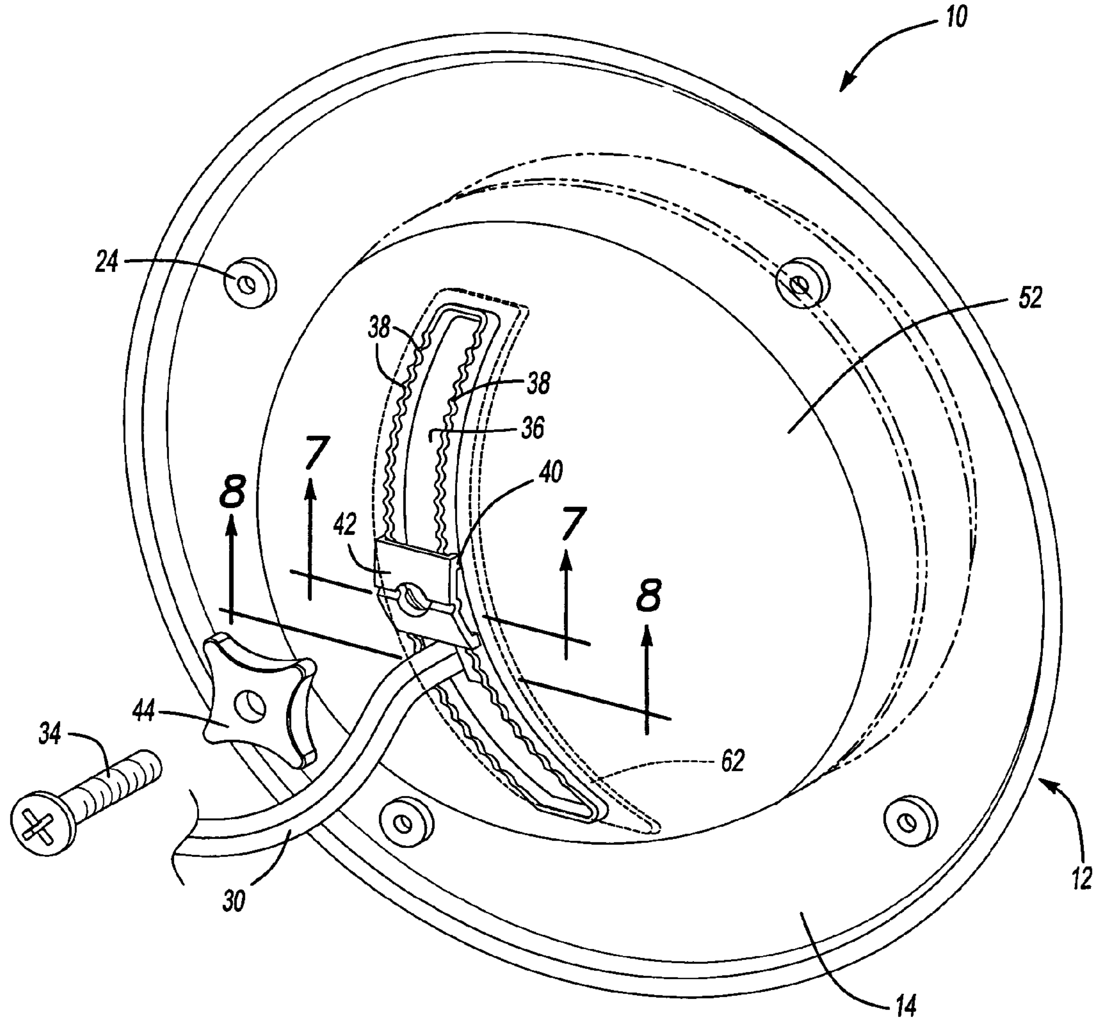
FIG. 6 is a rear perspective view showing the speaker housing secured to the adapter.
Figure 7:
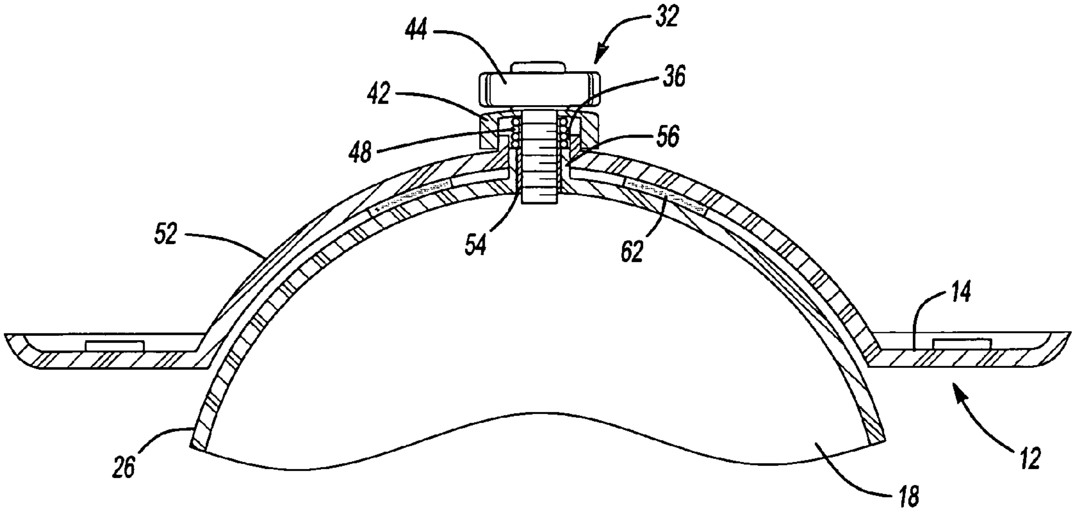
FIG. 7 is a cross-sectional view taken along the line 7-7 in FIG. 6.
Figure 8:
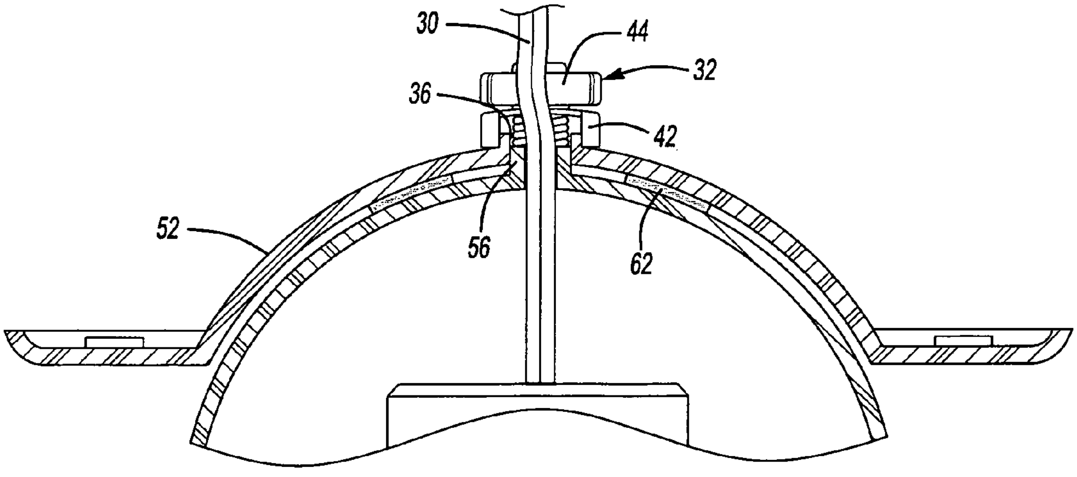
FIG. 8 is a cross-sectional view taken along the line 8-8 in FIG. 6.

Referring to FIGS. 6, 7, and 8, the function of the lock assembly 32 is explained in greater detail. The speaker housing assembly 10 is shown from the rear in FIG. 6 with the screw 34 and finger knob 44 exploded away from the concave portion 52. The speaker wire 30 extends from the speaker enclosure 18 through the arcuate slot 36. The flanges 40 of the spring clip 42 are shown in registry with the teeth 38 that are formed on opposite sides of the arcuate slot 36.

Referring specifically to FIG. 7, the section taken through the screw 34 illustrates the stack-up of the screw 34, finger knob 44, and spring clip 42 and also shows the nut 54 that receives the screw 34. The elastomeric pad 62 is shown between the concave portion 52 and the partially spherical sidewall 26.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An adjustable speaker housing assembly that is adapted to be secured to a wall, comprising:

an adapter for securing the speaker housing assembly to the wall, the adapter having
- i) a wall-mounting portion,
- ii) a recessed concave portion,
- iii) a guide track in the form of a linear slot arranged on the concave portion of the adapter, and
- iv) a first inter-engaging portion proximal to the guide track;

a speaker enclosure that is assembled to the concave portion of the adapter, the speaker enclosure having
- i) a convex portion inset into the concave portion of the adapter,
- ii) at least one speaker secured within the speaker enclosure, and
- iii) an interlocking element having a second inter-engaging portion that may be selectively locked relative to the guide track by engaging with the first inter-engaging portion to secure the speaker enclosure to the adapter in one position and may be unlocked to permit the speaker enclosure to be moved relative to the adapter.

2. The adjustable speaker housing assembly of claim 1 wherein the concave portion of the adapter is at least partially spherical and the convex portion of the speaker enclosure is complimentary in shape to the concave portion so that the speaker enclosure may slide relative to the adapter.

3. The adjustable speaker housing assembly of claim 1 wherein the concave portion of the adapter is an arcuate band and the convex portion of the speaker enclosure is complimentary in shape to the concave portion so that the speaker enclosure may slide relative to the adapter.

4. The adjustable speaker housing assembly of claim 3 wherein speaker wires extend from the speaker enclosure and through the linear slot that are adapted to be connected to an audio source.

5. The adjustable speaker housing assembly of claim 3 wherein the interlocking element further comprises a screw that is inserted through the guide track and is received by a threaded member attached to the speaker enclosure to secure the speaker enclosure and the adapter together.

6. The adjustable speaker housing assembly of claim 5 wherein the screw tightens the second inter-engaging portion of the interlocking element against the first inter-engaging portion of the adapter.

7. The adjustable speaker housing assembly of claim 1 wherein the concave portion of the adapter and the wall mounting portion are formed in one piece in a molding operation.

8. The adjustable speaker housing assembly of claim 1 wherein the concave portion is a first partially spherical wall and the convex portion of the speaker enclosure defines a second partially spherical wall.

9. The adjustable speaker housing assembly of claim 1 further comprising an elastomeric pad disposed between the concave portion and the convex portion.

10. The adjustable speaker housing assembly of claim 9 wherein the elastomeric pad is adhesively secured to the concave portion.

11. An adjustable speaker system that is adapted to be secured to a wall, comprising:

an adapter for securing the speaker system to the wall, the adapter having i) a wall-mounting portion having an inward face adapted to rest against the wall, and ii)

a recessed portion that extends beyond the inward face of the wall-mounting portion, such that the recessed portion would be located at least partially within the wall when the adapter is secured to the wall;

a speaker housing secured to the adapter in a partially recessed relationship with the speaker housing having a convex portion and including at least one speaker secured within the speaker housing; and wherein the convex portion is disposed within the recessed portion in a ball and socket relationship; and wherein said adapter further includes a guide track in the form of a linear slot formed in the recessed portion of the adapter.

12. The adjustable speaker system of claim 11 wherein the concave portion of the adapter is at least partially spherical and the convex portion of the speaker enclosure is complimentary in shape to the concave portion so that the speaker enclosure may slide relative to the adapter.

13. The adjustable speaker system of claim 11 further comprising a linear slot formed in the recessed portion of the adapter.

14. The adjustable speaker system of claim 13 wherein speaker wires extend from the speaker housing and through the linear slot that are adapted to be connected to an audio source.

15. The adjustable speaker system of claim 14 wherein a screw is inserted through the linear slot and is received by a threaded member attached to the speaker housing to secure the speaker housing and the adapter together.

16. The adjustable speaker system of claim 15 wherein the screw and threaded member are the sole connectors between the speaker enclosure and the adapter.

17. The adjustable speaker system of claim 11 wherein the recessed portion of the adapter and the wall mounting portion are formed in one piece in a molding operation.

18. The adjustable speaker system of claim 11 wherein the recessed portion is a first partially spherical wall and the convex portion of the speaker housing defines a second partially spherical wall.

19. The adjustable speaker system of claim 11 further comprising an elastomeric pad disposed between the recessed portion and the convex portion.

20. The adjustable speaker system of claim 19 wherein the elastomeric pad is adhesively secured to the recessed portion.

21. A speaker assembly comprising:

a) a first portion having i) a wall mounting portion, ii) a rounded concave portion, and iii) a slot formed in the concave portion;

b) a second portion having i) a rounded convex portion located within the rounded concave portion of the mounting adapter, and ii) speaker wires emerging from the rounded convex portion and passing through the slot in the recessed portion, c) an interlocking element that may be selectively locked to secure the second portion to the first portion in a fixed position and may be unlocked to permit the second portion to be moved relative to the first portion.

22. The speaker assembly of claim 21, wherein the interlocking element further comprises:

i) a first set of protrusions on the first portion adjacent the slot; and ii) at least one engaging flange adapted to engage with the first set of protrusions to prevent rotation of the second portion with respect to the first portion.

23. The speaker assembly of claim 22, wherein the interlocking element further comprises a clip upon which the at least one engaging flange is located.

24. The speaker assembly of claim 23, wherein the rounded convex portion of the second portion is located in the interior of the rounded concave portion of the first portion, and the clip is located on the exterior of the rounded concave portion of the first portion.

25. The speaker assembly of claim 24, further comprising a screw passing through the clip and the slot and into a threaded portion found on the rounded convex portion of the second, wherein the screw may be tightened thereby urging the at least one engaging flange into engagement with the first set of protrusions on the first portion so as to prevent rotation of the second portion relative to the first portion.

26. The speaker assembly of claim 25, further comprising a spring biasing the clip away from the first portion, wherein the screw may be loosened and the spring will urge the clip away from the first set of protrusions so as to allow rotation of the second portion relative to the first portion.

27. The speaker assembly of claim 21, wherein the rounded concave portion is partially spherical.

28. The speaker assembly of claim 21, wherein the rounded concave portion is an arcuate band.

29. The speaker assembly of claim 21, wherein the second portion further comprises a follower that is received within the slot, the follower having parallel walls that engage the opposite walls of the slot to guide the movement of the second portion relative to the first portion.

30. The speaker assembly of claim 29, wherein the speaker wires emerge from the follower.

* * * * *